US010809059B2

(12) United States Patent
Lan et al.

(10) Patent No.: US 10,809,059 B2
(45) Date of Patent: Oct. 20, 2020

(54) FOCUSING AND LEVELING DEVICE

(71) Applicant: SHANGHAI MICRO ELECTRONICS EQUIPMENT (GROUP) CO., LTD., Shanghai (CN)

(72) Inventors: Ke Lan, Shanghai (CN); Shihua Wang, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 0 days.

(21) Appl. No.: 16/465,354

(22) PCT Filed: Nov. 27, 2017

(86) PCT No.: PCT/CN2017/113118
§ 371 (c)(1),
(2) Date: May 30, 2019

(87) PCT Pub. No.: WO2018/099348
PCT Pub. Date: Jun. 7, 2018

(65) Prior Publication Data
US 2019/0390957 A1    Dec. 26, 2019

(30) Foreign Application Priority Data

Nov. 30, 2016   (CN) .......................... 2016 1 1089618

(51) Int. Cl.
*G01C 9/06*     (2006.01)
*G03F 7/20*     (2006.01)

(52) U.S. Cl.
CPC ............ *G01C 9/06* (2013.01); *G03F 7/70258* (2013.01)

(58) Field of Classification Search
CPC .......................... G02B 17/08; G02B 17/0892; G02B 17/0896; G02B 13/22; G02B 17/0812;
(Continued)

(56) References Cited

U.S. PATENT DOCUMENTS 4,558,949 A    12/1985   Uehara et al.
4,866,262 A    9/1989    Van der Werf et al.
(Continued)

FOREIGN PATENT DOCUMENTS

CN    101169602 A    4/2008
CN    101218482 A    7/2008
(Continued)

OTHER PUBLICATIONS

Office Action issued in corresponding JP application No. 2019-528720 dated Jun. 30, 2020.

*Primary Examiner* — Michael P Stafira
(74) *Attorney, Agent, or Firm* — Muncy, Geissler, Olds & Lowe, P.C.

(57) ABSTRACT

A focusing and leveling device calculates an amount of defocus and/or tilt of a substrate and includes an illumination unit, projection-side mark plate with projection-side slit mark, projection-side imaging group, deflection prism, beam splitter, detection unit and signal processing unit. A light beam emitted from the illumination unit passes through the projection-side mark plate and is trimmed into a probe beam directed by the projection-side imaging group onto a substrate surface. The prism deflects the probe beam reflected by the surface of the substrate for a first time so that it is incident on the substrate surface and reflected for a second time onto the projection-side imaging group. The beam splitter directs the probe beam that travelled through the projection-side imaging group onto the detection unit. The signal processing unit calculates the amount of defocus and/or tilt based on a measurement spot detected by the detection unit.

6 Claims, 3 Drawing Sheets

(58) Field of Classification Search
CPC ...... G02B 13/14; G02B 13/18; G02B 27/144;
G02B 13/143; G02B 17/002; G02B
17/008; G02B 17/045; G02B 17/0605;
G02B 17/082; G02B 17/0828; G02B
17/086; G02B 27/145; G02B 21/0028;
G02B 21/0076; G02B 23/2407; G02B
23/2423; G02B 26/0833; G02B 27/283;
G02B 27/4238; G02B 5/1809; G02B
5/1814; G02B 5/1847; G02B 5/32; G02B
6/3604; G02B 17/0856; G02B 19/0014;
G02B 19/0019; G02B 19/0028; G02B
19/0042; G02B 19/0047; G02B 19/0057;
G02B 19/0061; G02B 19/0076; G02B
19/0085; G02B 2027/0109; G02B
2027/0123; G02B 21/0012; G02B
21/0036; G02B 21/0068; G02B 21/025;
G02B 21/088; G02B 21/10; G02B
21/125; G02B 21/22; G02B 23/105;
G02B 25/001; G02B 26/0841; G02B
26/0883; G02B 26/0891; G02B 26/101;
G02B 27/0025; G02B 27/0037; G02B
27/0075; G02B 27/0103; G02B 27/09;
G02B 27/0927; G02B 27/0944; G02B
27/095; G02B 27/0977; G02B 27/1006;
G02B 27/106; G02B 27/1073; G02B
27/1086; G02B 27/12; G02B 27/126;
G02B 27/148; G02B 27/34; G02B 27/58;
G02B 3/00; G02B 3/0006; G02B 3/005;
G02B 3/0068; G02B 5/005; G02B 5/045;
G02B 5/0816; G02B 5/12; G02B 5/136;
G02B 5/1861; G02B 5/1876; G02B
5/1895; G02B 5/205; G02B 6/262; G02B
6/32; G02B 6/421; G02B 6/4246; G02B
6/4298; G02B 7/28; G03F 7/70225; G03F
7/70275; G03F 7/70791; G03F 7/70241;
G03F 7/70258; G03F 1/26; G03F 7/702;
G03F 7/70266; G03F 7/70308; G03F
7/70316; G03F 7/70441; G03F 7/70066;
G03F 7/70216; G03F 7/70358; G03F
7/70341; G03F 7/70566; G03F 7/70958;
G03F 7/70966; G03F 7/70075; G03F
7/70108; G03F 7/70191; G03F 7/70775;
G03F 9/7026; G03F 1/84; G03F 7/20;
G03F 7/7005; G03F 7/70133; G03F
7/70141; G03F 7/70183; G03F 7/70291;
G03F 7/70375; G03F 7/70383; G03F
7/704; G03F 7/7065; G03F 7/70891;
G03F 9/00; G03F 9/7034; G01N 21/6452;
G01N 2021/6417; G01N 21/6445; G01N
21/6456; G01N 21/648; G01N
2021/4709; G01N 21/21; G01N 21/49;
G01N 15/0211; G01N 15/1429; G01N
15/1434; G01N 15/1436; G01N 15/1456;
G01N 15/1459; G01N 2015/0222; G01N
2015/1006; G01N 2015/1454; G01N
2015/149; G01N 2021/3144; G01N
2021/435; G01N 2021/4707; G01N
2021/4733; G01N 2021/6441; G01N
2021/8825; G01N 2021/8845; G01N
21/33; G01N 21/3554; G01N 21/4785;
G01N 21/6458; G01N 21/9501; G01N
2201/0231; G01N 2201/0626; G01N
2201/063; G01N 2201/0635; G01N
2201/1211; G01J 3/02; G01J 3/0224;
G01J 3/10; G01J 3/14; G01J 3/2803;
G01J 11/00; G01J 1/0425; G01J 1/0474;
G01J 1/4257; G01J 2001/4261; G01J
2003/104; G01J 3/0218; G01J 3/0262;
G01J 3/0286; G01J 3/0291; G01J 3/0294;
G01J 3/0297; G01J 3/42; G01J 3/447;
G01B 11/002; G01B 11/026; G01B
11/08; G01B 11/24; G01B 11/2441;
G01B 2290/20; G01B 9/02039; G01B
9/02057

See application file for complete search history.

(56) References Cited

U.S. PATENT DOCUMENTS

| | | | | |
|---|---|---|---|---|
| 5,191,200 | A * | 3/1993 | van der Werf | G02B 21/241 250/201.4 |
| 5,227,862 | A * | 7/1993 | Oshida | G01B 11/0608 356/490 |
| 5,602,400 | A * | 2/1997 | Kawashima | G03F 9/7026 250/548 |
| 5,825,043 | A * | 10/1998 | Suwa | G03F 7/70275 250/548 |
| 6,034,780 | A * | 3/2000 | Kato | G03F 9/7026 250/548 |
| 6,124,601 | A * | 9/2000 | Yoshii | G03F 9/7026 250/548 |
| 7,489,399 | B1 * | 2/2009 | Lee | G01B 11/0641 356/369 |
| 8,223,345 | B2 | 7/2012 | Hidaka et al. | |
| 2002/0000520 | A1 * | 1/2002 | Kawaguchi | G01N 21/9501 250/492.1 |
| 2010/0062351 | A1 * | 3/2010 | Hidaka | G03F 9/7026 430/30 |
| 2018/0348145 | A1 * | 12/2018 | Witte | G01J 1/42 |

FOREIGN PATENT DOCUMENTS

| | | |
|---|---|---|
| CN | 102033438 A | 4/2011 |
| CN | 104482875 A | 4/2015 |
| CN | 104880832 A | 9/2015 |
| CN | 104880913 A | 9/2015 |
| CN | 105242501 A | 1/2016 |
| JP | H06188172 A | 7/1994 |
| JP | H0888170 A | 4/1996 |
| JP | H10154659 A | 6/1998 |
| TW | I329194 B | 8/2010 |

* cited by examiner

FOCUSING AND LEVELING DEVICE

TECHNICAL FIELD

The present invention relates to a device for focusing and leveling.

BACKGROUND

FIG. 1 shows a commonly-used conventional device for focusing and leveling, which includes, arranged sequentially along a path of light travelling therein, a projection-side mark plate 1, a projection-side front lens group 2, a projection-side rear lens group 3, a wafer 4, a detection-side front lens group 5, a detection-side rear lens group 6 and a detection-side mark plate 7. Wherein, the projection-side mark plate 1, the projection-side front lens group 2, the projection-side rear lens group 3 and the wafer 4 constitute a 4F system; the wafer 4, the detection-side front lens group 5, the detection-side rear lens group 6 and the detection-side mark plate 7 constitute another 4F system. Light emitted from an illumination unit passes through a mark on the projection-side mark plate 1 and then travels through the projection-side front lens group 2 and the projection-side rear lens group 3, thus forming a spot on the wafer 4. Light reflected from the spot on the wafer 4 transmits through the detection-side front lens group 5 and the detection-side rear lens group 6 and forms an image on the detection-side mark plate 7.

Referring to FIGS. 1 and 2, each of the projection-side mark plate 1 and the detection-side mark plate 7 define a slit allow passage of light therethrough, and when the wafer 4 is positioned on a desirable zero face (indicated by the dashed line in FIG. 2), the image of the projection-side slit formed on the detection-side mark plate 7 will be just centered at a center of the slit in the detection-side mark plate 7. However, if the wafer 4 is defocused or tilted, the center of the image of the projection-side slit on the detection-side mark plate 7 will shift away. As shown in FIG. 2, an amount of defocus, indicated at h, of the wafer 4 will lead to an offset, indicated at Δ, of an optical axis of the detection side, which can be geometrically calculated as:

$$\Delta = BC = AB \times \sin 2\alpha = \frac{h}{\sin\alpha} \times 2\sin\alpha\cos\alpha = 2h \times \cos\alpha;$$

$$AB = \frac{h}{\sin\alpha};$$

where, α represents an angle between the light and the wafer surface.

As a result of the defocusing of the wafer 4, a reduction in the optical energy that propagates through the detection-side slit will occur, which can serve as a basis for monitoring the defocusing or tilting of the wafer.

Since the conventional device incorporates two 4F systems arranged on opposing sides of the wafer respectively for projection and detection, it is complicated in structure, bulky, costly and does not allow easy construction.

SUMMARY OF THE INVENTION

It is an objective of the present invention to overcome the above-described problems with the conventional device, i.e., a complicated structure, large footprint, high cost and difficulties in construction, by presenting a novel device for focusing and leveling.

To this end, the subject matter of the present invention lies in:

a focusing and leveling device configured to calculate an amount of defocus and/or tilt of a substrate, the device including an illumination unit, a projection-side mark plate with a projection-side slit mark, a projection-side imaging group, a deflection prism, a beam splitter, a detection unit and a signal processing unit, the illumination unit configured to emit a light beam which passes through the projection-side mark plate and is thus trimmed into a probe beam, the projection-side imaging group configured to direct the probe beam onto a surface of the substrate, the deflection prism configured to deflect the probe beam that has been reflected by the surface of the substrate for a first time so that it is again incident on the surface of the substrate and reflected thereby for a second time onto the projection-side imaging group, the beam splitter configured to direct the probe beam that has travelled through the projection-side imaging group onto the detection unit, the signal processing unit configured to calculate the amount of defocus and/or tilt of the surface of the substrate based on a measurement spot detected by the detection unit.

Preferably, the deflection prism may have a cross section of an isosceles right triangle.

Preferably, an inclined face of the deflection prism may be perpendicular to an optical axis of the probe beam that has been reflected by the surface of the substrate for the first time, an intersection edge of two right-angle faces of the deflection prism intersects the optical axis of the probe beam that has been reflected by the surface of the substrate for the first time.

Preferably, the projection-side imaging group may include a front lens group and a rear lens group, the beam splitter disposed between the projection-side mark plate and the front lens group, wherein the probe beam that has exited the beam splitter travels sequentially through the front lens group and the rear lens group and is then incident on the surface of the substrate, and wherein the probe beam that has been reflected by the surface of the substrate for the second time travels sequentially through the rear lens group and the front lens group and is then reflected by the beam splitter onto the detection unit.

Preferably, the projection-side imaging group may include a front lens group, a mirror pair and a rear lens group, the beam splitter disposed between the mirror pair and the rear lens group, wherein the probe beam travels sequentially through the front lens group, the mirror pair, the beam splitter and the rear lens group and is then incident on the surface of the substrate, and wherein subsequent to the reflection on the surface of the substrate for the second time, the probe beam again propagates through the rear lens group and is then reflected by the beam splitter onto the detection unit.

Preferably, the device may further include a detection-side lens group disposed upstream of the detection unit along a direction of propagation of the light beam.

Preferably, the detection unit may include: a detection-side mark plate with a detection-side slit mark; and an optical energy detector, the optical energy detector configured to measure a change in optical energy that has propagated through the detection-side slit mark, which serves as a basis for calculating the amount of defocus and/or tilt of the surface of the substrate.

In the device, by using the deflection prism, the projection- and detection-side 4F systems are arranged on a single side of the substrate, which shrinks the footprint of the device and enhances its compactness. Moreover, the projection-side 4F system is multiplexed, dispensing with a separate detection-side 4F system and hence allowing a simple structure, easy construction and a reduction in fabrication cost. Further, since the probe beam is reflected twice at the substrate surface, the impact of any amount of defocus or tilt on the position of the formed spot is doubled, i.e., doubled measuring accuracy with the same detection ability.

BRIEF DESCRIPTION OF THE DRAWINGS

In FIGS. 1-2: 1—projection-side mark plate; 2—projection-side front lens group; 3—projection-side rear lens group; 4—wafer; 5—detection-side front lens group; 6—detection-side rear lens group; 7—detection-side mark plate.

In FIGS. 3-6: 10—projection-side mark plate; 20—projection-side imaging group; 21—front lens group; 22—rear lens group; 23—mirror pair; 30—deflection prism; 31—inclined face; 32—right-angle face; 40—beam splitter; 50—detection-side mark plate; 60—substrate; 70—detection-side lens group.

DETAILED DESCRIPTION

The above objects, features and advantages of the present invention will become more apparent and better understood from the following detailed description of a few specific embodiments thereof, which is to be read in connection with the accompanying drawings. Note that the figures are much simplified and may not be drawn to scale, and their sole purpose is to facilitate easy and clear explanation of these embodiments.

Embodiment 1

Figure 1:
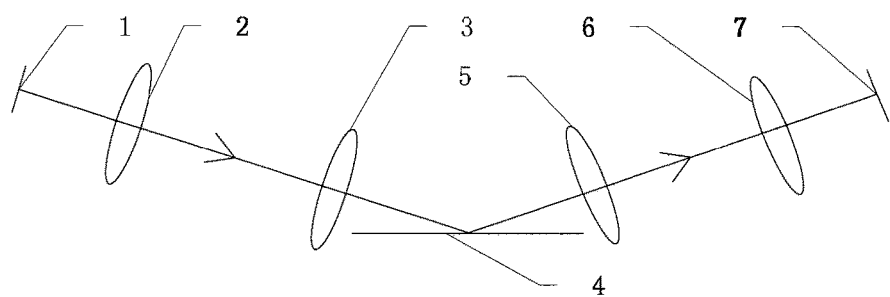
FIG. 1 schematically illustrates a conventional device for focusing and leveling.
Figure 2:
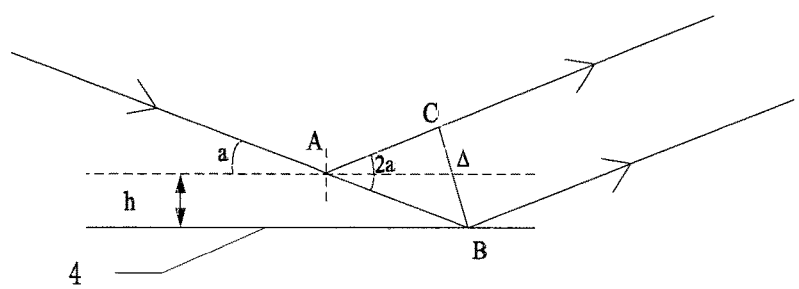
FIG. 2 is a diagram showing an optical path of the conventional device for focusing and leveling in which the surface of a wafer is defocused.
Figure 3:
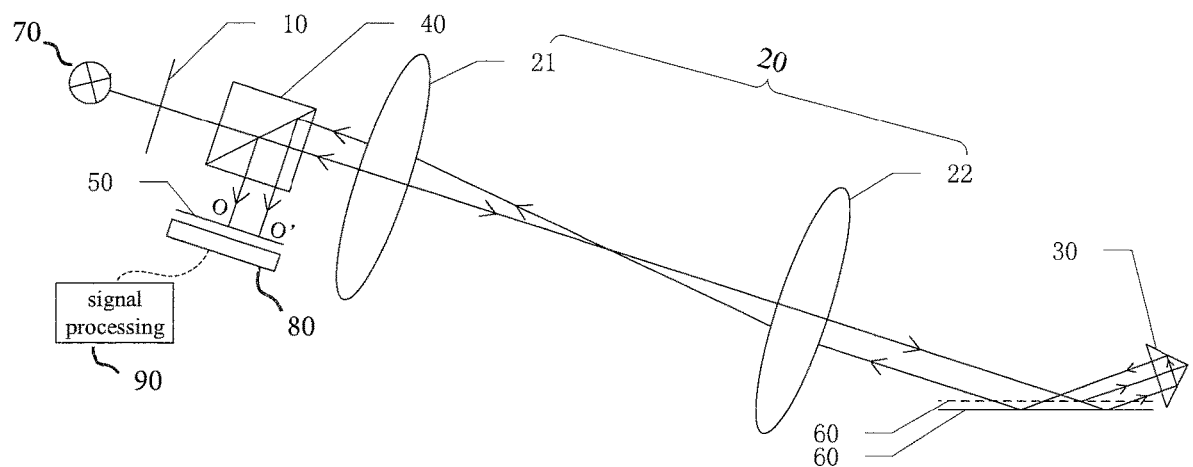
FIG. 3 is a structural schematic of a device for focusing and leveling according to a first embodiment of the present invention.

Referring to FIG. 3, a device for focusing and leveling includes, arranged sequentially along a path of a light beam travelling therein, an illumination unit 70, a projection-side mark plate 10 defining therein a projection-side slit mark, a projection-side imaging group 20, a deflection prism 30, a beam splitter 40, a detection unit and a signal processing unit 90. Emitted from the illumination unit, the light beam passes through the projection-side mark plate 10 is thus trimmed into a probe beam which then transmits through the beam splitter 40 and is directed by the projection-side imaging group 20 onto the surface of a substrate 60. The deflection prism 30 is configured to deflect the probe beam that has been reflected by the surface of the substrate 60 so that it is again incident on the surface of the substrate 60. The probe beam that has been reflected for the second time on the surface of the substrate 60 travels through the projection-side imaging group 20 and is then reflected by the beam splitter 40 onto the detection unit, thus forming a spot thereon. The signal processing unit then calculates an amount of defocus and/or tilt of the surface of the substrate 60 based on a measurement of the detection unit performed on the spot. Here, the term "deflection" refers to alternation of the direction of propagation of the probe beam. In this embodiment, "deflection" particularly refers to a change of 180 degrees in the direction of propagation of the probe beam. The substrate 60 may be a silicon wafer or a glass substrate.

The deflection prism 30 may have a cross section assuming the shape of an isosceles right triangle whose apex angles are respectively of 45, 90 and 45 degrees. An inclined face 31 of the deflection prism 30 is perpendicular to an optical axis of the probe beam that has been reflected by the surface of the substrate 60 for the first time, while an intersection edge of the two right-angle faces 32 intersects the optical axis of the probe beam that has been reflected by the surface of the substrate 60 for the first time.

The projection-side imaging group 20 may include a front lens group 21 and a rear lens group 22. The probe beam exiting the projection-side mark plate 10 propagates sequentially through the beam splitter 40, the front lens group 21 and the rear lens group 22 and is then incident on the surface of the substrate 60. The projection-side mark plate 10, the front lens group 21, the rear lens group 22 and the substrate 60 constitute a projection 4F system. Additionally, the probe beam that has been reflected by the surface of the substrate 60 for the second time travels through the rear lens group 22 and the front lens group 21 and is then reflected by the beam splitter 40 onto a detection-side mark plate 50 in the detection unit. The substrate 60, the rear lens group 22, the front lens group 21 and the detection-side mark plate 50 constitute a detection-side 4F system. The multiplexing of the lens groups dispenses with a separate detection-side 4F system and allows a simple structure, easy construction and a reduction in fabrication cost.

In addition to the detection-side mark plate 50 which defines therein a detection-side slit mark, the detection unit may further include an optical energy detector 80 for measuring a change in the optical energy that has propagated through the detection-side slit mark.

Detailed below is a possible process for constructing the device for focusing and leveling.

At first, an orientation of the deflection prism 30 may be determined. Specifically, an internal focusing telescope (not shown) may be arranged upstream of the beam splitter 40 in such a manner that an optical axis of a parallel beam emanated from the internal focusing telescope is perpendicular to a right-angle face of the beam splitter 40 facing toward the internal focusing telescope. The orientation of the deflection prism 30 may be then tuned so that an optical axis of the probe beam reflected from the inclined face of the deflection prism 30 is coincident with the optical axis of the parallel beam from the internal focusing telescope.

Subsequently, the position of the deflection prism 30 may be determined. Specifically, the deflection prism 30 may be translated incrementally along the direction in which the inclined face of the deflection prism 30 extends until an intensity distribution of the probe beam within the deflection prism 30 is symmetric with respect to a bisecting normal (e.g., BF in FIG. 4) of the inclined face (at this point, the intersection edge of the two right-angle faces of the prism intersects the projection-side optical axis) of the deflection prism 30.

Figure 4:
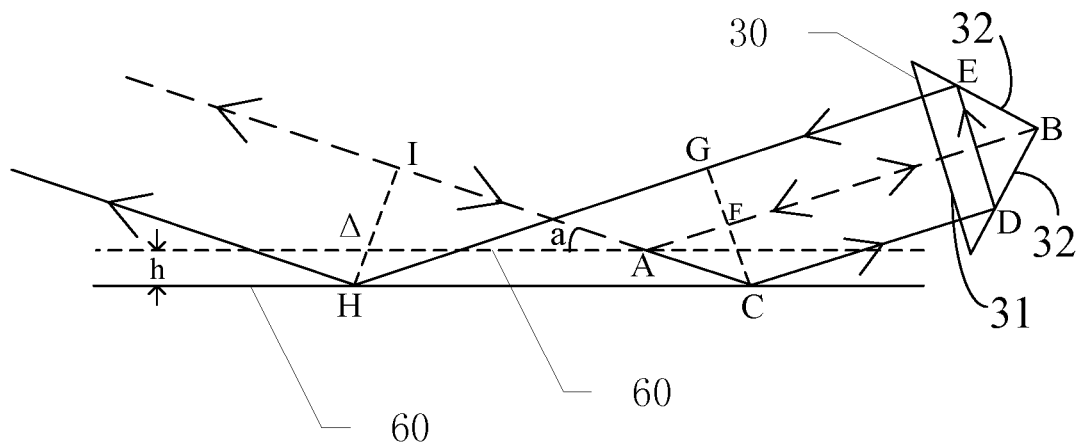
FIG. 4 is a diagram showing an optical path of the device for focusing and leveling according to the first embodiment of the present invention, in which a substrate is defocused.
Figure 5:
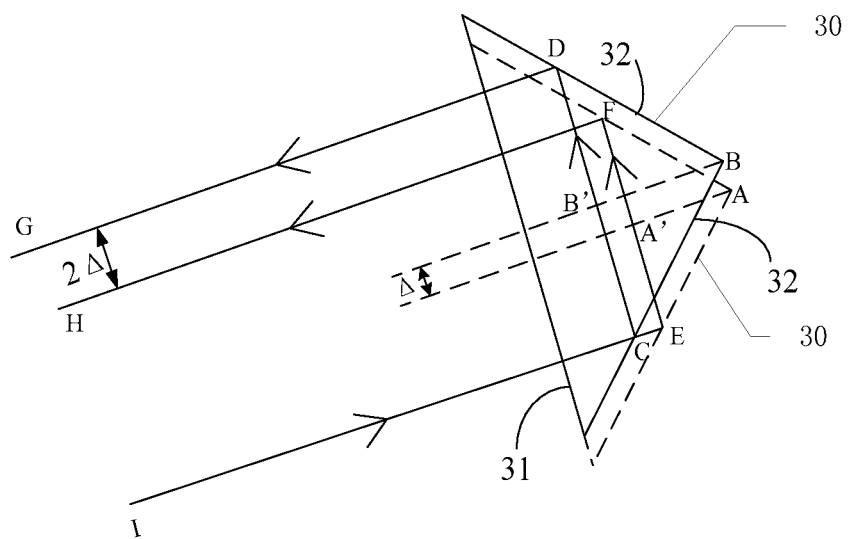
FIG. 5 is a diagram showing an optical path of the device for focusing and leveling according to the first embodiment of the present invention, in which a deviation occurs during the positioning of a deflection prism.

Referring to FIG. 5, assuming a deviation of $\Delta$ in the position of the deflection prism 30 along the direction in which the inclined face 31 extends and the deflection prism 30 is translated (in this figure, the solid-line box represents the actual position of the deflection prism 30, while the dash-line box indicates a desirable position for the deflection prism 30, which is offset from the actual position by the translational deviation $\Delta$) and a deviation h in the position of the substrate 60 (in FIGS. 3 and 4, the solid line represents the actual position of the substrate 60, while the dash line indicates a desirable position for the substrate 60), a traverse path length of the exiting probe beam will change from $EF=2\times EA'=2\times(CB'-\Delta)=2\times CH-2\Delta$ (dashed, FH) to $CD=2\times CB'$. That is, the translational deviation $\Delta$ of the deflection prism 30 will lead to a traverse shift of the probe beam that is equal to $2\Delta$. As can be seen from FIG. 3, this traverse shift of the exiting probe beam will lead to a positional shift of the spot formed on the detection-side mark plate 50 (from O to O'). The traverse shift of the exiting probe beam is in a constant proportion to the positional shift of the spot formed on the detection side.

Referring to FIG. 4, when the substrate 60 is placed at the desirable position (dashed), the probe beam incident thereon will be reflected by the substrate and deflected by the deflection prism 30 and then follow the exact same path back onto the substrate 60. The probe beam that has been reflected for the second time by the substrate 60 will then propagate through the projection-side imaging group 20 and the beam splitter 40 and form the spot on the detection-side mark plate 50. However, when the substrate 60 is defocused by the amount h (solid), after the incident probe beam is reflected and deflected by the deflection prism 30, it will follow a return path back to the substrate 60, which is laterally offset from that in the desirable scenario by an amount expressed as $HI=CG=2\times CF=4h\times\cos\alpha$, where $\alpha$ presents an angle of incidence of the probe beam on the substrate 60. Therefore, the deviation between the actual position O' and the desirable position O of the probe beam in FIG. 3 can be obtained as $4h\times\cos\alpha\times\beta$ (where, $\beta$ denotes a magnification from the substrate 60 to the detection-side mark plate 50). The distance O'O is measurable, from which the amount of defocus h of the substrate 60 can be calculated according to the above expression.

The above defocus amount (h) calculation may be performed on one or more points on the substrate surface. When there is more than one point, a plane fitted to the calculation results may be compared with the horizontal to determine whether the substrate is tilted. Therefore, the device for focusing and leveling according to this embodiment is suitable for calculating an amount of defocus and/or tilt of a substrate.

As noted above, on the one hand, the device for focusing and leveling allows structural simplicity and compactness by multiplexing the projection-side 4F system (and hence dispensing with a separate detection-side 4F system). On the other hand, since the probe beam is reflected twice at the substrate surface, the impact of any amount of defocus or tilt on the position of the formed spot is doubled. As can be seen from the above mathematical expression, this means doubled measuring accuracy.

Embodiment 2

Figure 6:
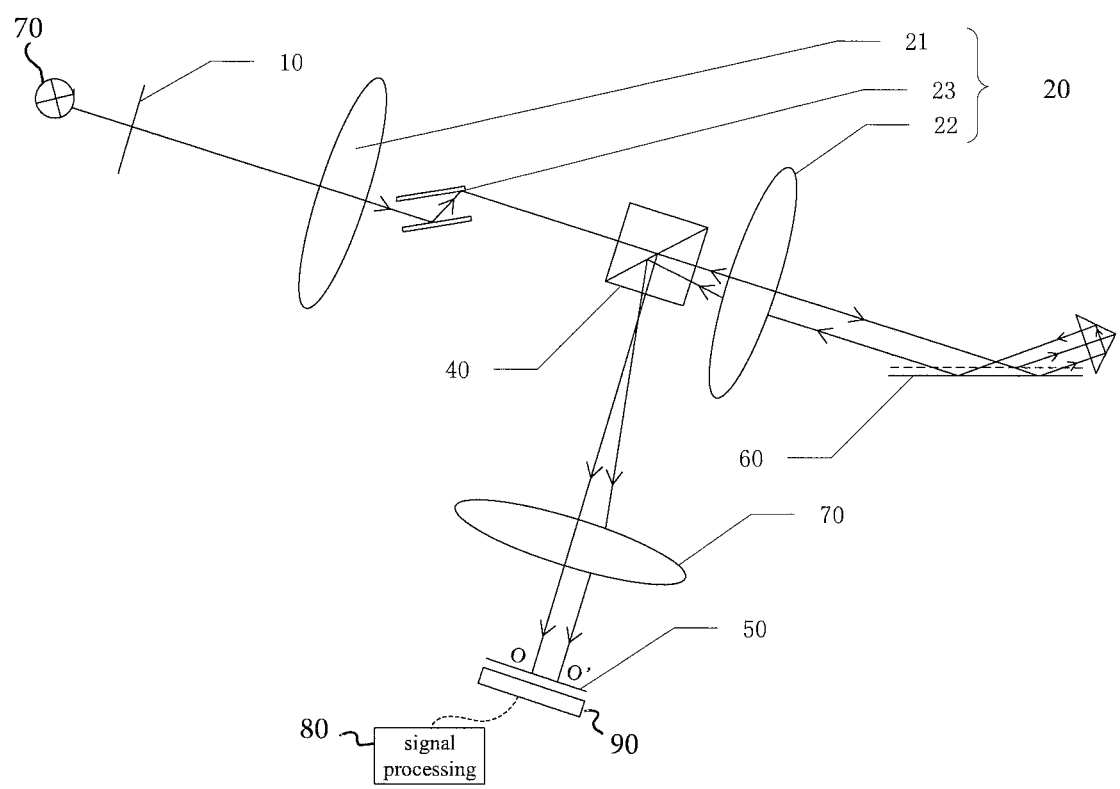
FIG. 6 is a structural schematic of a device for focusing and leveling according to a second embodiment of the present invention.

Referring to FIG. 6, Embodiment 2 differs from Embodiment 1 essentially in the paths of propagation of the probe beam to the surface of the substrate 60 and from the second reflection to the detection-side mark plate 50. Specifically, the projection-side imaging group 20 includes a front lens group 21, a mirror pair 23 and a rear lens group 22. The probe beam from the projection-side mark plate 10 travels sequentially through the front lens group 21, the mirror pair 23, the beam splitter 40 and the rear lens group 22, and is then incident on the surface of the substrate 60. Additionally, subsequent to the reflection on the surface of the substrate 60 for the second time, the probe beam again propagates through the rear lens group 22 and is then reflected by the beam splitter 40 onto the detection-side mark plate 50. The mirror pair 23 according to the embodiment includes a fixed mirror and a moveable mirror capable of changing the exit direction of the probe beam.

The device for focusing and leveling according to this embodiment further includes a detection-side lens group 70. The detection-side lens group 70 is disposed between the beam splitter 40 and the detection unit 50.

Likewise, the device for focusing and leveling according to this embodiment is also suitable for calculating an amount of defocus and/or tilt of a substrate with doubled measuring accuracy.

The description presented above is merely that of a few preferred embodiments of the present invention, and various changes and modifications may be made thereto by those of ordinary skill in the art without departing from the spirit and scope of the invention. Accordingly, the invention is intended to embrace all such changes and modifications if they fall within the scope of the appended claims and equivalents thereof.

The invention claimed is:

1. A focusing and leveling device for calculating an amount of defocus and/or tilt of a substrate, comprising an illumination unit, a projection-side mark plate with a projection-side slit mark, a projection-side imaging group, a deflection prism, a beam splitter, a detection unit and a signal processing unit, the illumination unit configured to emit a light beam which passes through the projection-side mark plate and is thus trimmed into a probe beam, the projection-side imaging group configured to direct the probe beam onto a surface of the substrate, the deflection prism having a cross section of an isosceles right triangle and having an inclined face and two right-angle faces; each of an optical axis of the projection-side imaging group and the inclined face of the deflection prism being inclined with respect to the surface of the substrate, wherein the probe beam that has been reflected by the surface of the substrate for a first time is directly incident into the deflection prism and deflected inside the deflection prism through the two right-angle faces of the deflection prism so that the probe beam is again incident on the surface of the substrate and reflected by the surface of the substrate for a second time onto the projection-side imaging group, the beam splitter configured to direct the probe beam that has been reflected by the surface of the substrate for the second time onto the detection unit, the signal processing unit configured to calculate the amount of defocus and/or tilt of the surface of the substrate based on a measurement spot detected by the detection unit.

2. The focusing and leveling device of claim 1, wherein the inclined face of the deflection prism is perpendicular to an optical axis of the probe beam that has been reflected by the surface of the substrate for the first time, and an intersection edge of the two right-angle faces of the deflection prism intersects the optical axis of the probe beam that has been reflected by the surface of the substrate for the first time.

3. The focusing and leveling device of claim 1, wherein the projection-side imaging group comprises a front lens group and a rear lens group, the beam splitter disposed between the projection-side mark plate and the front lens group, wherein the probe beam that has exited the beam splitter travels sequentially through the front lens group and the rear lens group and is then incident on the surface of the substrate, and wherein the probe beam that has been reflected by the surface of the substrate for the second time travels sequentially through the rear lens group and the front lens group and is then reflected by the beam splitter onto the detection unit.

4. The focusing and leveling device of claim 1, wherein the projection-side imaging group comprises a front lens group, a mirror pair and a rear lens group, the beam splitter disposed between the mirror pair and the rear lens group, wherein the probe beam travels sequentially through the front lens group, the mirror pair, the beam splitter and the rear lens group and is then incident on the surface of the substrate, and wherein subsequent to the reflection on the surface of the substrate for the second time, the probe beam again propagates through the rear lens group and is then reflected by the beam splitter onto the detection unit.

5. The focusing and leveling device of claim 1, further comprising a detection-side lens group disposed upstream of the detection unit along a direction of propagation of the light beam.

6. The focusing and leveling device of claim 1, wherein the detection unit comprises:
   a detection-side mark plate with a detection-side slit mark; and an optical energy detector, the optical energy detector configured to measure a change in optical energy that has propagated through the detection-side slit mark, which serves as a basis for calculating the amount of defocus and/or tilt of the surface of the substrate.

\* \* \* \* \*